United States Patent
Laermer

(10) Patent No.: US 7,361,287 B2
(45) Date of Patent: *Apr. 22, 2008

(54) METHOD FOR ETCHING STRUCTURES IN AN ETCHING BODY BY MEANS OF A PLASMA

(75) Inventor: Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 192 days.

This patent is subject to a terminal disclaimer.

(21) Appl. No.: 10/473,831

(22) PCT Filed: Jun. 28, 2002

(86) PCT No.: PCT/DE02/02363

§ 371 (c)(1),
(2), (4) Date: Mar. 31, 2004

(87) PCT Pub. No.: WO03/028081

PCT Pub. Date: Apr. 3, 2003

(65) Prior Publication Data

US 2004/0173571 A1    Sep. 9, 2004

Related U.S. Application Data

(63) Continuation of application No. 09/720,758, filed on Dec. 28, 2000, now Pat. No. 6,720,268.

(30) Foreign Application Priority Data

Apr. 30, 1999 (DE) .............................. 199 19 832
Sep. 14, 2001 (DE) .............................. 101 45 297

(51) Int. Cl.
*C23F 1/00* (2006.01)
*H01L 21/00* (2006.01)

(52) U.S. Cl. .............................. 216/67; 216/41; 216/68; 216/79; 438/706; 438/700; 438/710

(58) Field of Classification Search .................. 216/67, 216/41, 79, 68, 59; 438/700, 710, 706
See application file for complete search history.

(56) References Cited

U.S. PATENT DOCUMENTS 4,799,991 A    1/1989   Dockrey (Continued)

FOREIGN PATENT DOCUMENTS

DE    42 41 045    5/1994

(Continued)

OTHER PUBLICATIONS

English Language Abstract of JP 8020880, no date.

(Continued)

*Primary Examiner*—Shamim Ahmed
(74) *Attorney, Agent, or Firm*—Kenyon & Kenyon LLP

(57) ABSTRACT

A method is proposed for etching structures into an etching body, in particular, recesses which are laterally precisely defined by an etching mask, into a silicon body, using a plasma. In the process, a high-frequency pulsed, low-frequency modulated high-frequency power is coupled at least intermittently into the etching body using a high-frequency a.c. voltage and, in addition, the intensity of the plasma is modulated as a function of time.

17 Claims, 4 Drawing Sheets

U.S. PATENT DOCUMENTS

| | | | |
|---|---|---|---|
| 4,863,549 A * | 9/1989 | Grunwald | 156/345.44 |
| 5,290,383 A | 3/1994 | Koshimizu | |
| 5,437,895 A * | 8/1995 | Kodama et al. | 427/578 |
| 5,486,993 A * | 1/1996 | Sakurai et al. | 363/98 |
| 5,683,538 A * | 11/1997 | O'Neill et al. | 156/345.28 |
| 5,711,814 A * | 1/1998 | Mori | 118/723 E |
| 5,779,925 A | 7/1998 | Hashimoto et al. | |
| 5,880,034 A | 3/1999 | Keller | |
| 5,888,414 A | 3/1999 | Collins et al. | |
| 5,997,687 A | 12/1999 | Koshimizu | |
| 6,060,329 A | 5/2000 | Kamata et al. | |
| 6,110,287 A * | 8/2000 | Arai et al. | 156/345.34 |
| 6,187,685 B1 | 2/2001 | Hopkins et al. | |
| 6,214,162 B1 | 4/2001 | Koshimizu | |
| 6,720,268 B1 * | 4/2004 | Laermer et al. | 438/700 |
| 6,777,037 B2 * | 8/2004 | Sumiya et al. | 427/569 |
| 6,926,844 B1 | 8/2005 | Laermer et al. | |
| 2004/0124177 A1 * | 7/2004 | Urban et al. | 216/67 |
| 2004/0173571 A1 | 9/2004 | Laermer | |

FOREIGN PATENT DOCUMENTS

| | | |
|---|---|---|
| DE | 199 27 806 | 1/2001 |
| DE | 199 33 842 | 2/2001 |
| DE | 199 57 169 | 6/2001 |
| DE | 100 51 831 | 5/2002 |
| DE | 101 45 297 | 4/2003 |
| EP | 0 140 294 | 5/1985 |
| JP | 8020880 | 1/1996 |
| WO | WO 97/14177 | 4/1997 |
| WO | WO01/39261 | 5/2001 |

OTHER PUBLICATIONS

Wolf et al., "Silicon Processing for The VLSI Era" 1986, 4 sheets, pp. 568 and 569, Latice Press.

* cited by examiner

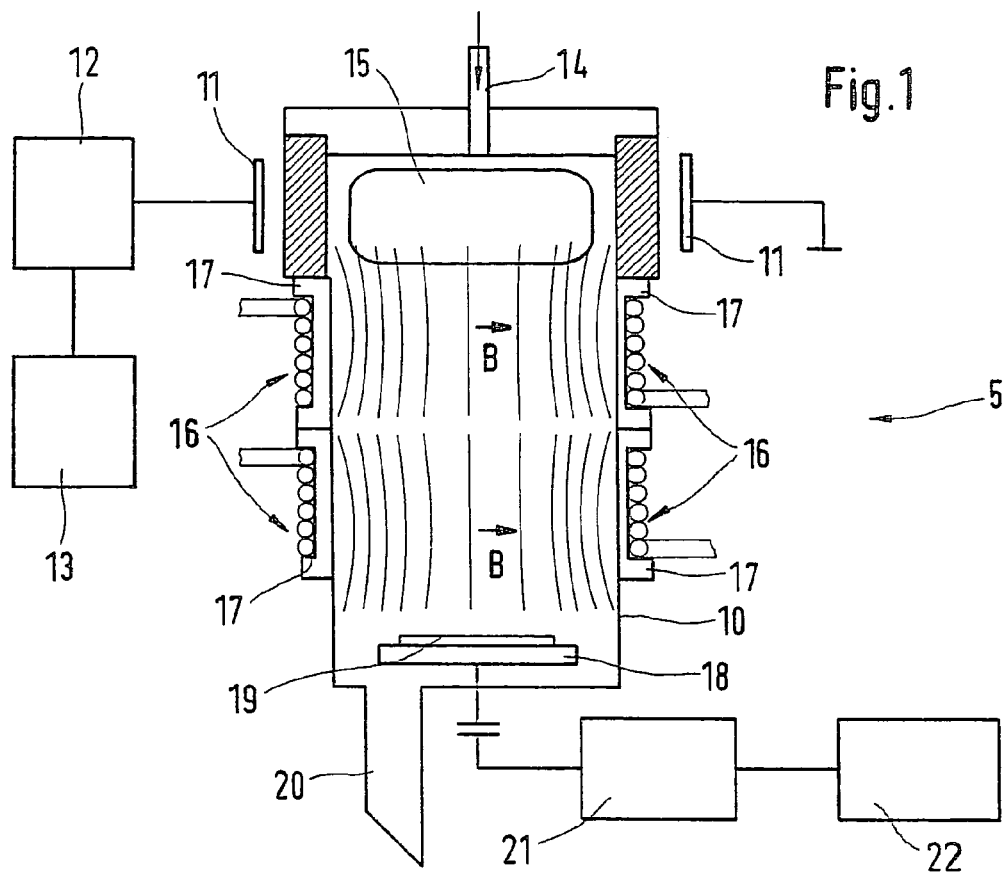
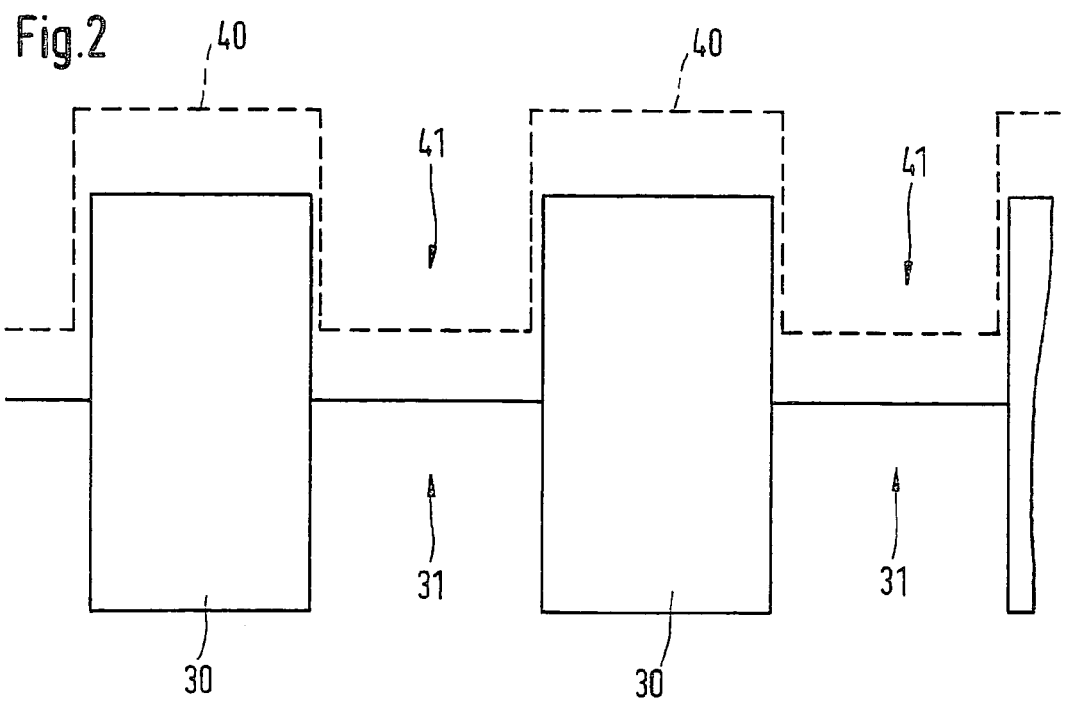

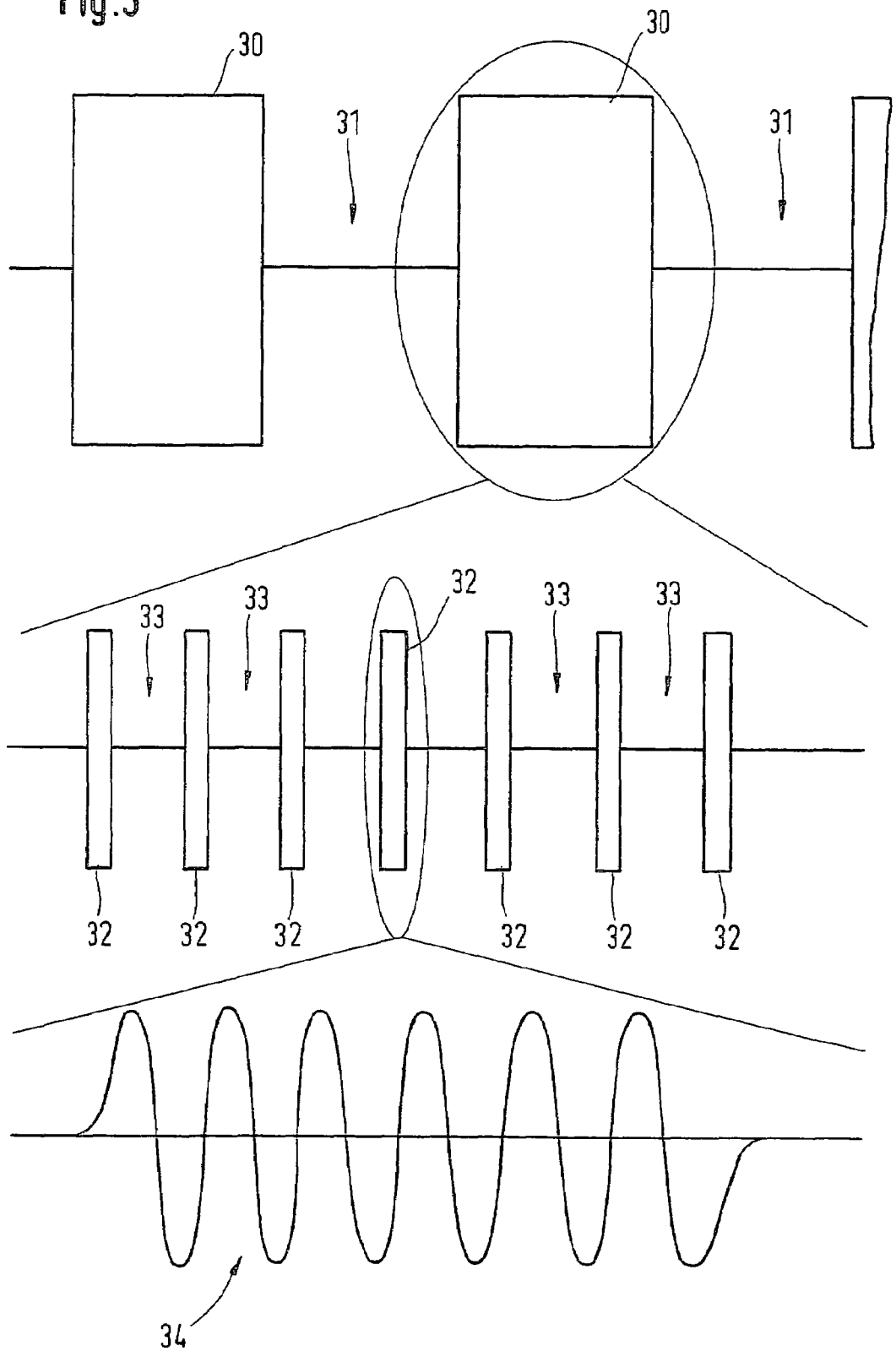

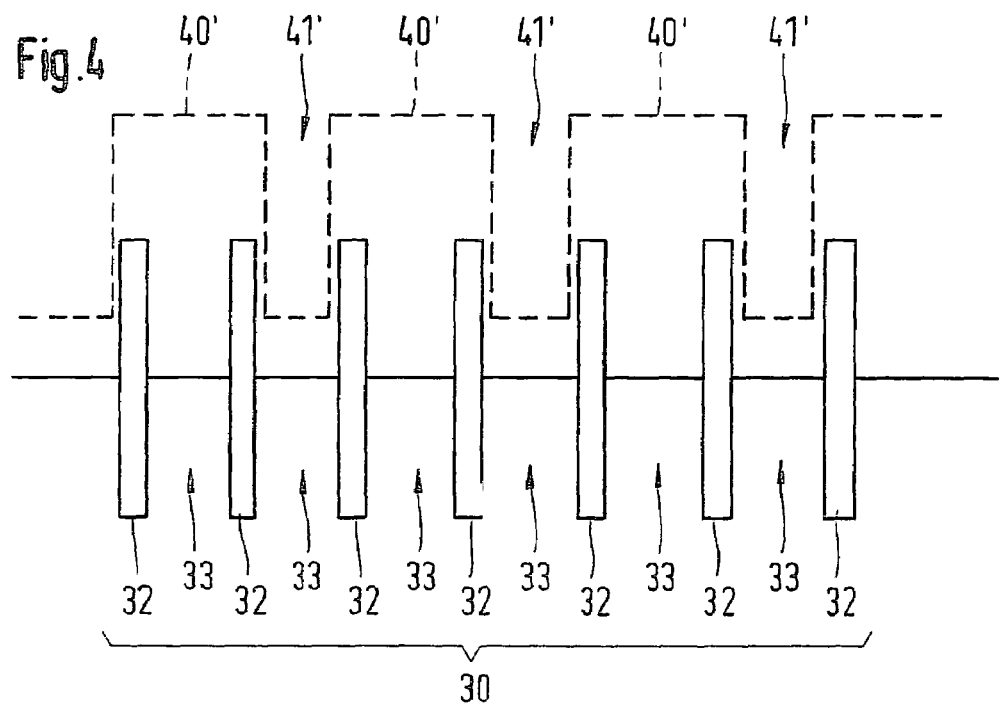
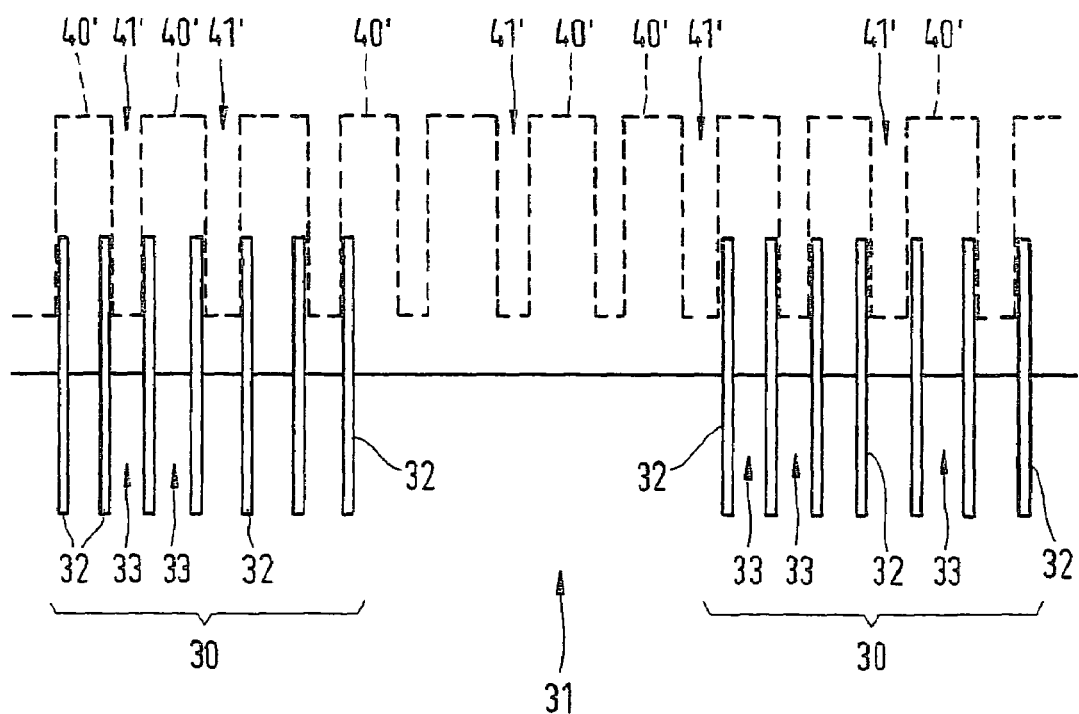

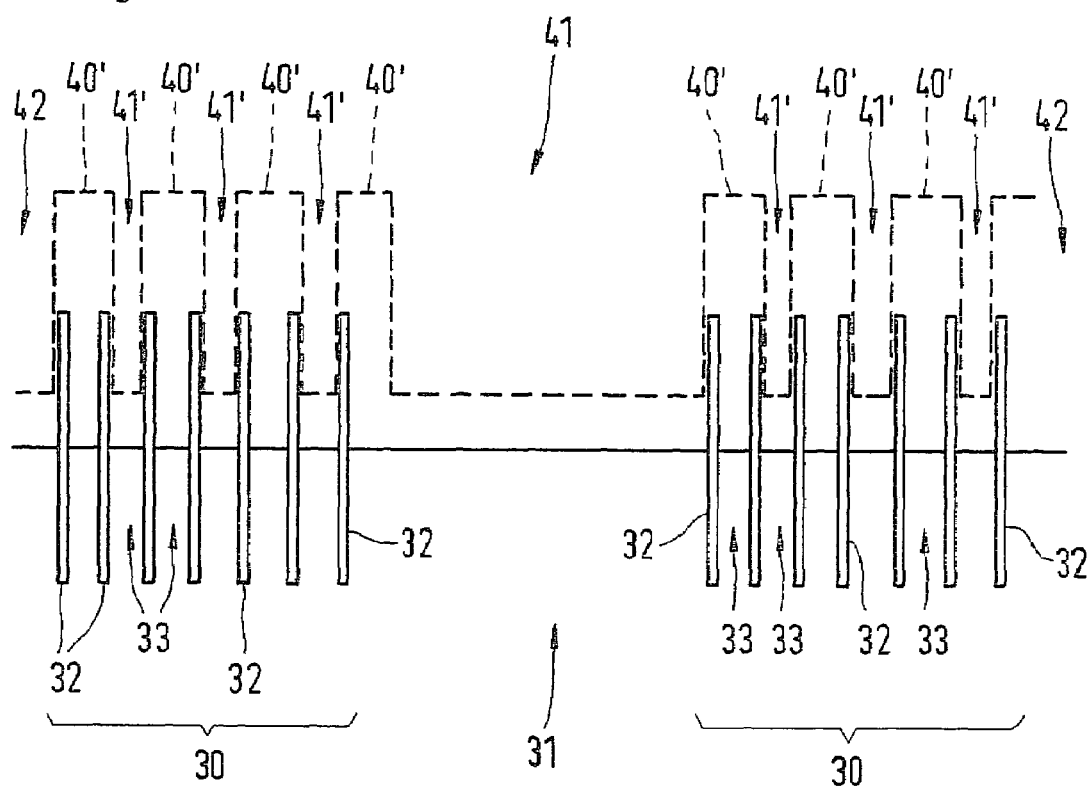

METHOD FOR ETCHING STRUCTURES IN AN ETCHING BODY BY MEANS OF A PLASMA

RELATED APPLICATION

This application is a continuation under 35 U.S.C § 120 of U.S. application Ser. No. 09/720,758, filed on Dec. 28, 2000, now U.S. Pat. No. 6,720,268.

FIELD OF THE INVENTION

The present invention is directed to a method for etching structures into an etching body, in particular, laterally precisely defined recesses into a silicon body, using a plasma.

BACKGROUND INFORMATION

In plasma etching processes for etching laterally precisely defined recesses into a silicon body, of the type described, for example, in the German Patent No. 42 41 045, the problem of insufficient pocket stability often occurs, i.e., deviations from the desired etching profile arise, in particular at the boundary surface between the etching body and a dielectric interface, for example between the silicon and the silicon dioxide located underneath.

To resolve this, the German Published Patent Application No. 199 57 169 already describes a so-called double-pulse technique, where, via a low-frequency pulsation of a high-frequency modulated carrier signal having a high peak-pulse power at the substrate electrode in the etching chamber of an inductively coupled plasma etching system, this undesired pocket formation is suppressed and, at the same time, a wide process window is achieved for the plasma etching process. In this way, adequate pocket stability is achieved, in particular, at aspect ratios of the etched-in structures of 5:1 to 10:1, as is a certain tolerance to overetching. However, at even higher aspect ratios of the formed trenches and, accordingly, long overetching times, the pocket formation cannot be completely suppressed using this process.

German Published Patent Application No. 199 33 842 proposes also pulsing the inductively coupled plasma source, so that during plasma-discharge pauses, anions occurring at greater rates contribute to the discharging of positive charges of a dielectric etching base in structures having a high aspect ratio. A significant problem arises when pulsing ICP (inductively coupled plasma) plasma sources in that high levels of reflected power occur in the assigned high-frequency generator, since undefined conditions prevail in the plasma during ignition of the plasma discharge. These transient conditions make it difficult to adapt the injected high-frequency power to the plasma impedance. Thus, the igniting of the plasma discharge represents a transition from an electrically capacitively coupled to an inductively coupled mode, which leads to errors in impedance adaptations and, thus, to high levels of reflected power.

To overcome these problems, German Published Patent Application No. 199 27 806 proposes using a feedback circuit of the Meissner oscillator type, including the plasma source as a frequency-determining element, and a high-frequency generator as an amplifier in the feedback path, to release the frequency of the excitation voltage during the transient phases. The drawback of this method is, however, that frequencies can occur outside of the frequency range approved for industrial systems, so that appropriate shielding is required.

Finally, the German Patent Application No. 100 51 831.1 already proposes a device and a method for etching a substrate using an inductively coupled plasma, where a static or time-variable magnetic field is provided between the substrate and the ICP source. The magnetic field is generated by at least two superposed magnetic coils that are traversed in opposite directions by current.

SUMMARY OF THE INVENTION

An object of the present invention is to provide a method for etching structures into an etching body, having an improved pocket stability, particularly at high aspect ratios of the etched-in structures and given long overetching times.

The method according to the present invention has the advantage over the related art of providing substantially enhanced pocket stability in the etching of silicon, for example, particularly when a buried dielectric etch barrier, such as an $SiO_2$ layer, is reached, and of providing an improved tolerance to overetching.

Thus, it is particularly advantageous when the intensity of the plasma is modulated or pulsed in such a way that the plasma discharging does not quite extinguish during the "discharge pauses" and remains in the inductively coupled mode. This means that, during this time span, just the right amount of high-frequency power is supplied to the plasma source, i.e., to the inductively coupled plasma, that is needed to maintain a minimal discharge. Because the plasma is not completely extinguished during these discharge or pulse pauses, a high level of reflected power is prevented from occurring the next time the plasma is run up to a maximal intensity, since the electrically capacitively coupled starting phase of the plasma discharging is substantially avoided, and is started right in the inductively coupled phase of the plasma discharge.

In this context, it is also advantageous when the high-frequency power coupled into the substrate electrode, which is accomplished in accordance with the double-pulse technique described in German Published Patent Application No. 199 57 169, is temporally correlated or synchronized with the modulation of the plasma intensity.

It is also advantageous in this connection that, during the discharge pauses, the plasma, previously dominated by positively charged ions and electrons, changes into a so-called "ambipolar" plasma of positively and negatively charged ions, i.e., in so-called "after-glow" phases, free electrons are captured, either by being recombined with positively charged ions or as the result of capture of neutral particles. Due to the preponderance in numbers of the neutral particles surrounding the electrons, it is the generation of anions as the result of capturing of electrons that is the dominant reaction in the process. Thus, while in a "normal" plasma, the number of negative charge carriers having a mass corresponding to a multiple of the proton mass is smaller by three to four orders of magnitude than the number of positive charge carriers having a mass corresponding to a multiple of the proton mass, in these phases, the number of these negative and positive charge carriers is, at this point, virtually the same. Since, as the proportion of free electrons becomes smaller in comparison to the ions in the plasma, the consequences of the unequal charge carrier masses and charge carrier mobilities disappear, the plasma potential of previously positive values in the range of some 10 volts approaches a value of 0 V, so that, at this point, positive, as well as negative charge carriers are able to reach, in the same way, the etching body to be processed, for example a silicon wafer, making possible an optimal charge compensation there, in the context of high aspect ratios as well.

It may be that an inductively coupled plasma is not able to be maintained completely without electrons, however, the less dense the electrons are, in this context, the more equivalent positive and negative charge carriers become, and the more effective the neutralization of interfering charging will be. A particular advantage of the method according to the present invention is when the electron density is as low as possible, and/or may be kept as low as possible when implementing the invention.

Finally, the modulation of the plasma intensity undertaken as a function of time may advantageously be accomplished in addition to a high-frequency power from the corresponding coil generator that changes, in particular, periodically over time and is injected into the plasma, alternatively or additionally also by a, for example, periodically changing field strength of a magnetic field acting on the plasma, for example of a magnetic field of a device of the type according to German Patent Application No. 100 51 831.1.

BRIEF DESCRIPTION OF THE DRAWINGS

FIG. 1 shows a basic sketch of a plasma etching device for implementing the method according to the present invention.

FIG. 2 illustrates a first exemplary embodiment of a time modulation of the plasma intensity, which is synchronized with the high-frequency pulsed, low-frequency modulated high-frequency power, which is coupled into the substrate electrode.

FIG. 3 depicts the structure of the high-frequency pulsed, low-frequency modulated high-frequency power in accordance with FIG. 2.

FIG. 4 shows a second exemplary embodiment of the modulation of the plasma intensity and its synchronization with the high-frequency power coupled into the substrate electrode.

FIG. 5 illustrates a third exemplary embodiment, also during the low-frequency clocked pulse pauses.

FIG. 6 shows the second exemplary embodiment also during the low-frequency clocked pulse pauses.

DETAILED DESCRIPTION

FIG. 1 shows a plasma-etching system 5 known from the German Patent Application No. 100 51 831.1, which is used, for example, to carry out an anisotropic plasma etching process in silicon to produce trenches in the manner described by German Patent No. 42 41 045. In detail, an etching chamber 10 and a substrate electrode 18, for example a silicon wafer, having a substrate 19 placed thereon, are additionally provided. Furthermore, substrate electrode 18 is connected to a second match-box 21 for purposes of impedance adaptation and electrically connected via this match-box to a substrate power generator 22.

In the top region of etching chamber 10, a coil 11 surrounding etching chamber 10 is connected via a first match-box 12 to a coil generator 13 for purposes of impedance adaptation. Via mentioned coil generator 13 and first match-box 12, with the aid of coil 11, a high-frequency power is coupled into etching chamber 10, so that an inductively coupled plasma 15 forms there. In accordance with FIG. 1, it is additionally provided for etching chamber 10, in its top region, to have a gas inlet 14 and, in its lower region, a gas discharge 20 for supplying and discharging, respectively, of process gases, for example alternately etching gases and passivation gases.

Finally, between the area where inductively coupled plasma 15 is produced and substrate electrode 18, etching chamber 10 is surrounded by two field coils 16, two corresponding spacers 17 being inserted into the side wall of etching chamber 10 in order to accommodate these coils 16.

With respect to the detailed design of plasma etching system 5, reference is made to the explanations given in German Patent Application No. 100 51 831.1.

To modulate the intensity of plasma 15 as a function of time with the aid of coil generator 13 and first match-box 12, the device known from German Published Patent Application No. 199 27 806 or preferably from German Published Patent Application No. 199 33 842 is provided. As described in these documents, it is integrated for example, in first match-box 12 or coil generator 13.

In addition, using substrate power generator 22, second match-box 21, and substrate electrode 18, a high-frequency pulsed, low-frequency modulated high-frequency is injected into substrate 19, as described in German Published Patent Application No. 199 57 169.

FIG. 3 illustrates this high-frequency pulsed, low-frequency modulated high-frequency power, low-frequency clocked pulse packets 30 and low-frequency clocked pulse pauses 31 having a frequency of, for example, 1 Hz to 500 Hz, preferably 10 Hz to 250 Hz, for example 100 Hz, being injected so as to alternate periodically into substrate electrode 18, at a so-called "duty cycle" of 20 to 80%, preferably 50%, and an average power of preferably 5 to 20 watts, for example 10 watts. In this context, the low-frequency clocked pulse packets 30 in accordance with FIG. 3 are composed of a periodically alternating sequence of high-frequency clocked pulses 32 and high-frequency clocked pulse pauses 33, the frequency of this period preferably being 10 kHz to 500 kHz, for example 100 kHz, and the "duty cycle" preferably being 2 to 20%, for example 5%. With respect to the time average, the average power injected in the process into substrate electrode 18, for example, at 5 to 40 watts, in particular at 20 watts, is during the high-frequency clocked pulses 32.

Finally, it is discernible in FIG. 3 than an individual, high-frequency clocked pulse 32 is made up of a high-frequency carrier signal having a frequency of, for example, 13.56 MHz and a high-frequency power of preferably 100 watts to 1 kwatt, for example 400 watts. For further details regarding FIG. 3, reference is also made to the German Published Patent Application No. 199 57 169.

In the case of the signal shapes at substrate electrode 18 in accordance with FIG. 3, one must observe, in particular, pulse pauses 31 of sufficient length, produced by the low-frequency clocking, while the discharging into the etched trenches may take place in the area of a dielectric boundary layer. While this slow pulsing normally reduces the process stability and, thus, leads to a narrow process window, the additional, high-frequency modulation of high-frequency carrier signal 34 with a lowest possible pulse-to-pause ratio ("duty cycle"), for example a ratio of 1:10 or 1:20, a very high substrate electrode voltage, with a simultaneously low current flow to substrate electrode 18, so that a very broad, tolerant process window nevertheless results. In this context, the "duty cycle" controls the current-voltage relation and, thus, the apparent ohmic resistance of plasma 15, considered from substrate electrode 18.

FIG. 2 elucidates a first exemplary embodiment of the method of the present invention, the high-frequency pulsed, low-frequency modulated high-frequency power in substrate electrode 18 being synchronized with the modulation of the plasma intensity precisely in such a way that a plasma excitation having minimal power (plasma almost extinguished), i.e., a first plasma intensity minimum 41, coincides in each case with low-frequency clocked pulse pauses 31. This leads to an intensified discharging of the formed trenches during the low-frequency clocked pulse pauses 31, since there is not only a spontaneous discharging of the trenches, but anions are also increasingly attracted to the structure base and neutralize the positive charges there.

The clock ratio of 1:1 sketched in FIG. 2, i.e., the ratio of the time duration of the first plasma intensity maxima 40 to the time duration of the first plasma intensity minima 41, is merely exemplary. Rather, for reasons of plasma excitation efficiency, it is beneficial for plasma 15 to be excited as long as possible and blanked for the shortest possible time. In other words, when sampling the excitation or the plasma intensity, it is advantageous to adjust a ratio of clearly less than 1:1 to ensure that the required pulse peak powers of the high-frequency power coupled into plasma 15 do not become enormous. For example, for an average power on coil 11 of 3 kW to 5 kW, given a pulse duty factor of 1:1, 6 kW to 10 kW pulse peak power is already needed to attain the desired time average.

Finally, it is discernible from FIG. 2 that the time durations of first plasma intensity maxima 40 and of subsequent first plasma intensity minima 41 are equal to the time durations of low-frequency clocked pulse packets 30 and of subsequent low-frequency clocked pulse pauses 31, respectively. Moreover, the intensity of plasma 15 during first plasma intensity minima 41 is selected to be so low that plasma 15 does not quite extinguish during these plasma intensity minima.

FIG. 4 illustrates a second exemplary embodiment of the modulation of the plasma intensity being synchronized using the high-frequency pulsed, low-frequency modulated high-frequency power in substrate electrode 18. To maintain a highest possible clock ratio in the process, two or more high-frequency clocked pulses 32 at substrate electrode 18 fall within a second plasma intensity maximum 40', for example, as shown, and during the subsequent, high-frequency clocked pulse pause 33, plasma 15 is switched to a "low" mode, i.e., the plasma intensity reaches a second plasma intensity minimum 41' that is selected to be so low that plasma 15 does not quite extinguish in this time period. This being the case, two or more high-frequency clocked pulses 32 fall within a second plasma intensity maximum 40' before high-frequency clocked pulse pauses 33 coincide again with second plasma intensity minimum 41'.

The advantage of the exemplary embodiment according to FIG. 4 over that of FIG. 2 is that fewer charges are able to accumulate in the formed trenches during the relatively long "on" times of the comparatively low-frequency modulation of the plasma intensity. Because only comparatively few high-frequency clocked pulses 32, for example 20 at a maximum, coincide each time with second plasma intensity maximum 40', only relatively few electrical charges accumulate during this time in the trenches, before a discharging occurs again during a subsequent, second plasma intensity minimum 41'.

It is rather even the case that the greatest anion concentrations in plasma 15 exist only during a short time span during and immediately after second plasma intensity maximum 40' breaks down, i.e., the maximum discharge effect is achieved only for a brief period of time during and after the transition to second plasma intensity minimum 41'. After that, only a clearly reduced anion concentration is still present in plasma 15. This speaks in favor of shortest possible plasma intensity minima 41' and a correspondingly high discharge efficiency. Moreover, in the case of the plasma excitation or of the high-frequency power injected into plasma 15 in the exemplary embodiment according to FIG. 4, it is not advisable to have a pulse duty factor of substantially less than 1:1, since, otherwise, the required pulse peak powers for the plasma generation become uneconomically high.

Specifically, the high-frequency power injected into inductively coupled plasma 15 is again between 3 kW and 5 kW; the frequency of high-frequency clocked pulses 32 and of subsequent high-frequency clocked pulse pauses 33 is, for example 100 kHz, given a "duty cycle" of 5%; and the average high-frequency power injected into substrate electrode 18 during low-frequency clocked pulse packets 30 is, for example, 20 watts, it being additionally noted that FIG. 4 merely shows the modulation of the plasma intensity during a single, low-frequency clocked pulse packet 30 in accordance with FIG. 2. This low-frequency clocked pulse packet 30 is then followed by a low-frequency clocked pulse pause 31 in accordance with FIG. 2, during which the intensity of plasma 15 also drops simultaneously to first plasma intensity minimum 41 in accordance with FIG. 2 and remains there during the time of low-frequency clocked pulse pauses 31. For illustration purposes, this is fully shown in FIG. 6.

FIG. 5 clarifies a third exemplary embodiment of a time synchronization of a modulation of the intensity of plasma 15 using the high-frequency pulsed, low-frequency modulated high-frequency power which is injected into substrate electrode 18. Here, in contrast to FIG. 6, the time modulation of the intensity of plasma 15 in accordance with FIG. 4 is also maintained during the low-frequency clocked pulse pauses 31.

In this manner, during relatively long, low-frequency clocked pulse pauses 31, the term "relatively long" being understood as a reference to the decay time of the anion concentration in plasma 15 following its breakdown or the transition of the plasma intensity to second plasma intensity minimum 41', plasma 15 is run up and run down again, so that the phases of a plasma breakdown along with the elevated anion concentrations associated therewith, are to be constantly repeated. In this respect, low-frequency clocked pulse pause 31 is used more effectively in that, at its beginning, a plasma breakdown accompanied by an elevated anion concentration is not only generated once, which subsequently, measured by the time duration of low-frequency clocked pulse pauses 31, quickly decays again, rather such phases are made available again and again for the discharging of the trenches generated in the etching body. This being the case, low-frequency clocked pulse pauses 31 are, at this point, no longer used only for the spontaneous discharging of the trenches, rather "anion concentration peaks", which accelerate the discharging process, are additionally made available periodically during low-frequency clocked pulse pauses 31. Moreover, as a result of this procedure, the problem of a too small "duty cycle" is mitigated for the plasma generation, since, by decoupling the plasma generation from the low-frequency modulation of the high-frequency power at substrate electrode 18, a "duty cycle" of better than 1:1 is now also easily attainable.

To adjust and stabilize the intensity of plasma 15 to intensity minimum 41, 41' to a point close to extinction of plasma 15, one utilizes the fact that the power reflected into coil generator 13 rises suddenly when extinction of plasma 15 i.e., its passing from an inductive mode over to an electrically capacitively coupled mode, is imminent. This condition is able to be held off by immediately running up the forward power of coil generator 13, and held at the boundary of the inductively coupled operating mode, so that the thus increased power of coil generator 13 raises the electron density in plasma 15 again to the value of a stabile operating condition.

In this context, forward power $P_{Forward}$ of coil generator 13 is coupled into plasma intensity 41, 41' along with power $P_{Reflected}$ reflected into coil generator 13:

$$P_{Forward} = P_{setpoint} + V \cdot P_{Reflected}$$

V being a gain constant of the control loop for which it preferably holds that: V>>1. In modern high-frequency generators, the case V=1 corresponds to the usual "load" control, i.e., the forward power is regulated in response to the occurrence of reflected power in such a way that the difference between the forward power and the reverse power, i.e., the high-frequency power actually coupled into plasma 15, corresponds to the predefined setpoint value and remains constant. This case of customary "load" control is frequently inadequate for stabilizing plasma 15 at the critical mode boundary, since, in this case, the high-frequency power effectively coupled into plasma 15 does not increase in the manner required to hold off a collapsing plasma 15. In this respect, control factor V is preferably adjusted to values clearly greater than 1, for example to values between 5 and 10, as a setpoint selection ($P_{setpoint}$), a value as close as possible or even somewhat below the value being additionally adjusted, which is required for a boundary operation of plasma 15, i.e., an intensity just above the extinction of plasma 15.

It is also noted that the pulse strategy elucidated above, i.e., the modulation of the plasma intensity and of the high-frequency power coupled into substrate electrode 18, may be used as a function of time in a process in the manner of German Patent No. 42 41 045, both in the course of the deposition cycles as well as during the etching cycles. Typically, it suffices, however, to limit them to etching cycles, since the danger of pocket formation only exists during the etching cycles. In addition, during the deposition cycles, the full generator power is then available. Also, it is often advantageous during the deposition cycles, to completely switch off the coupling of high-frequency power into substrate electrode 19.

One especially simple modulation of the intensity of plasma 15 is derived by using an inductively coupled plasma source using a solenoid coil system, as described in German Patent Application No. 100 51 831.1 and shown in FIG. 1. In this case, between the ICP source, i.e., inductively coupled plasma 15 and substrate 19, at least two magnetic field coils are arranged, one top magnetic field coil 16 facing the ICP source, and one bottom magnetic field coil facing substrate 19, which are traversed by opposite electric currents, generally of different magnitudes, so that they produce oppositely directed magnetic fields of typically different intensities.

In detail, top magnetic field coil 16 facing the ICP source is adjusted to a magnetic field strength, as is required for an optimal plasma generation, while lower magnetic field coil 16 facing substrate 19 produces an oppositely directed magnetic field whose intensity is adjusted in the manner required for producing optimal etching uniformity, i.e., for optimal distribution of the energy input over the surface of substrate 19.

The initial effect achieved by using magnetic field coils 16 is, above all, that in the borderline case of a plasma that does not quite extinguish, it is possible to maintain a plasma 15 that has a lower excitation density and electron concentration than would be possible without such coils. This is due to the fact that the generated magnetic field prolongs "the lifetime" of the electrons in plasma 15 in that wall losses in the source region are reduced so that, in this way, a desired "ambipolar" plasma having a minimal density of free electrons may be maintained very effectively during plasma intensity minima 41, 41'.

To be able, at this point, to modulate the intensity of plasma 15, in a plasma etching system 5 in accordance with FIG. 1, not only is the high-frequency power coupled by coil generator 13 via coil 11 into plasma 15 available, but additionally or alternatively thereto, the strength of the magnetic field within chamber 10 generated by field coils 16, as well. Thus, to adjust first plasma intensity maximum 40, one initially applies coil currents in field coils 16, which correspond to the target current values of the process in accordance with German Patent Application No. 100 51 831.1, i.e., for example, 10 amperes for top field coil 16 and 7 amperes for the oppositely poled bottom field coil 16.

To switch over, after that, to plasma intensity minimum 41, 41', these currents are then reduced, for example, in such a way that both currents in field coils 16 are synchronously reduced to zero or are clocked. Alternatively, however, intermediate values may also be approached, for example 3 amperes for top field coil 16 and 2 amperes for bottom field coil 16.

In this respect, in the simplest specific embodiment, both coil currents are switched back and forth, at the same time, between a high and a low extreme value, the same effect being produced as when the power of coil generator 13 is run down, i.e., the plasma density collapses when the magnetic coil currents are withdrawn and reaches plasma intensity minimum 41, 41', a high anion density being briefly created from the recombination of electrons and neutral gas particles. In this context, however, it has to be considered that magnetic coil currents are not able to be modulated as quickly as the high-frequency power coupled into plasma 15. Particularly, due to the inductance of field coils 16, merely clock frequencies of below 10 kHz are possible. On the other hand, it is substantially simpler and less problematic to vary a d.c. current than it is to vary a high-frequency a.c. voltage using coil generator 13.

To avoid reflected power, it is furthermore especially favorable when the change in the electric current does not follow instantaneously in field coils 16, but rather has a final rate of change, which, of course, also holds for varying the high-frequency power of coil generator 13, where an impedance matching is generally accomplished more easily using first match-box 12, by a slowest possible change in power.

This final rate of change is able to be effected quite easily by modulating the magnetic coil currents, since one merely needs to superimpose a modulation voltage of final slope steepness on a direct voltage or a d.c. current.

Thus, within the framework of the elucidated exemplary embodiment, for example, an a.c. voltage and, as the case may be, an a.c. current is applied at both field coils 16, which varies in accordance with the equations $$U_1(t) = U_{01} \cdot \sin(\omega t) \quad U_2(t) = -U_{02} \cdot \sin(\omega t)$$

In this context, the a.c. voltages or currents at both field coils 16 are in phase opposition at every instant, $U_{01}$ and $U_{02}$ designating the voltage amplitudes or current amplitudes at one of the two magnetic field coils 16, in each instance.

Alternatively, it is also possible to work with rectified a.c. voltages or currents, it then being necessary to replace the expression sin(ωt) with the absolute value abs(sin(ωt)).

Finally, as previously explained, it is also frequently advantageous not to reduce the magnetic coil currents to zero. The coil voltages or coil currents traversing the two field coils 16 then follow the equations, for example:

$$U_1(t) = U_{offset,1} + U_{01} \cdot abs(sin(\omega t))$$

$$U_2(t) = U_{offset,2} - U_{02} \cdot abs(sin(\omega t))$$

In the process, the offset currents or offset voltages $U_{offset,1}$ or $U_{offset,2}$ are each dimensioned in such a way that the occurrence of so-called "beaking effects" in the edge region of substrate 19 is still effectively suppressed and, consequently, a homogeneous etching result is still attained in this way over the entire substrate surface.

If, furthermore, frequency ω in accordance with the preceding equations is comparatively low, i.e., for example 10 Hz to 50 Hz, and the rate of first match-box 12 used is high enough for the impedance adaptation for such a modulation of the plasma intensity to follow, it is even possible in this way to altogether avoid the occurrence of reflected power into coil generator 13 and, nevertheless, to significantly suppress the undesired pocket formation. What is important, in this context, is only that the density of plasma 15 be modulated and that the phases of elevated anion concentration be periodically available which provide for a discharging of trenches with a high aspect ratio.

What is claimed is:

1. A method for etching a structure into an etching body using a plasma, comprising:
   coupling a high frequency pulsed, low frequency modulated high frequency power into the etching body using a high frequency a.c. voltage;
   modulating the plasma in its intensity as a function of time intermittently between a maximum value, maintained for a first period of time, and a minimum value, maintained for a second period of time, by modulating a second high-frequency power coupled into the plasma; and
   selecting the minimum value such that the plasma does not extinguish during the second period of time.

2. The method as recited in claim 1, wherein:
   the structure is etched into a recess of a silicon body, and the recess is laterally precisely defined by an etching mask.

3. The method as recited in claim 1, wherein:
   the intensity of the plasma is modulated periodically.

4. The method as recited in claim 3, wherein:
   the intensity is modulated by rectangular pulses.

5. A method for etching a structure into an etching body using a plasma, comprising:
   coupling a high frequency pulsed, low frequency modulated high frequency power into the etching body using a high frequency a.c. voltage;
   in a first time segment, continually modulating the intensity of the plasma periodically between a maximum value, maintained for a first time period of time, and a minimum value, maintained for a second period of time by modulating a second high-frequency power coupled into the plasma;
   selecting the minimum value such that the plasma does not extinguish during the second time period; and
   in a second time segment, lowering the intensity of the plasma for a third time period to one of zero and an intensity value that is reduced as compared to the maximum value.

6. The method as recited in claim 5, wherein:
   the intensity is modulated by rectangular pulses.

7. The method as recited in claim 5, wherein:
   the intensity value during the second time segment corresponds to that at which the plasma does not quite extinguish.

8. The method as recited in claim 7, wherein:
   the first time segment and the second time segment alternate periodically.

9. The method as recited in claim 7, wherein:
   the first time segment and the second time segment are repeated in immediate succession.

10. The method as recited in claim 1, further comprising:
    correlating the high frequency pulsed, low frequency modulated high frequency power and the modulated plasma intensity with one another in such a way that at times during which a low frequency clocked pulse packet is coupled into the etching body, a maximum value of the plasma intensity exists.

11. The method as recited in claim 10, further comprising:
    correlating the high frequency pulsed, low frequency modulated high frequency power and the modulated plasma intensity with one another in such a way that at times when a low frequency clocked pulse pause is present at the etching body, an minimum value of the plasma intensity exists.

12. The method as recited in claim 11, wherein:
    the low frequency clocked pulse packet includes a multiplicity of alternating, high frequency clocked pulses and alternating, high frequency clocked pulse pauses,
    a time period of the alternating, high-frequency clocked pulses and a time period of the alternating, high frequency clocked pulse pauses define a first pulse to pause ratio,
    a first time period during which the modulated plasma intensity has the maximum value and a second time period during which the modulated plasma intensity has a minimum value define a second pulse to pause ratio, and
    the second pulse to pause ratio is greater than the first pulse to pause ratio.

13. The method as recited in claim 12, wherein:
    a frequency with which the alternating, high frequency clocked pulses and the alternating, high frequency clocked pulse pauses of a high frequency power repeat is greater than a frequency with which the maximum value and the minimum value of the intensity of the modulated plasma repeat.

14. The method as recited in claim 12, wherein:
    a frequency with which the low frequency clocked pulse packets and the low frequency clocked pulse pauses repeat is at least approximately equal to a frequency with which a first time segment and a second time segment repeat.

15. The method as recited in claim 12, wherein:
    a frequency with which the low frequency clocked pulse packets and the low frequency clocked pulse pauses repeat is at least approximately no more than a frequency with which the first time period and the second time period repeat.

16. The method as recited in claim 1, wherein:
    the high frequency pulsed, low frequency modulated high frequency power changes periodically over time.

17. The method as recited in claim 1, further comprising:
    connecting the etching body to a substrate electrode to which the high frequency pulsed, low frequency modulated high frequency power is applied.

* * * * *